United States Patent [19]
Miura et al.

[11] Patent Number: 5,454,930
[45] Date of Patent: Oct. 3, 1995

[54] ELECTROLYTIC COPPER PLATING USING A REDUCING AGENT

[75] Inventors: Takeshi Miura, Oomiya; Masaru Seita, Ina, both of Japan

[73] Assignee: Learonal Japan Inc., Tokyo, Japan

[21] Appl. No.: 333,890

[22] Filed: Jul. 28, 1994

Related U.S. Application Data

[63] Continuation of Ser. No. 929,164, Aug. 11, 1992, abandoned.

[30] Foreign Application Priority Data

Aug. 15, 1991 [JP] Japan ..................... 3-205101

[51] Int. Cl.$^6$ ................. C25D 3/38; C25D 5/54
[52] U.S. Cl. .......... 205/159; 205/125; 205/164; 205/166; 205/169; 205/296; 205/916
[58] Field of Search .................. 205/125, 159, 205/164, 166, 169, 184, 187, 296, 916

[56] References Cited

U.S. PATENT DOCUMENTS

| | | | |
|---|---|---|---|
| 2,644,787 | 7/1953 | Bonn | 204/43 |
| 4,228,201 | 10/1980 | Feldstein | 427/92 |
| 4,459,184 | 7/1984 | Kukawskis | 204/30 |
| 4,478,690 | 10/1984 | Scholtens | 204/15 |
| 5,059,243 | 10/1991 | Sagannathan et al. | 106/1.26 |

FOREIGN PATENT DOCUMENTS

WO82/00666  3/1982  WIPO ................ C25D 3/38

OTHER PUBLICATIONS

F. A. Lowenheim, *Electroplating*, McGraw–Hill Book Co., New York, 1978, pp. 152–155, 420–423.

*Primary Examiner*—John Niebling
*Assistant Examiner*—William T. Leader
*Attorney, Agent, or Firm*—Emmanuel J. Lobato

[57] ABSTRACT

An electrolytic copper plating method using a reducing agent is provided, wherein a catalyzed, electrically nonconductive substrate is dipped in a solution, which contains a copper salt, a copper-reducing agent for the acceleration of copper deposition and a copper-complexing agent and has a pH value of about 6 to 7.5, for electrolysis at a temperature of about 15° C. to 50° C., thereby forming an electrically conductive film of copper on said electrically nonconductive substrate. This method can be used in place of conventional electroless copper plating, dispense with any harmful substance such as formaldehyde, be easily analyzed and controlled, form an electrically conductive film of copper on an electrically nonconductive substrate with improved adhesion thereto, and is effectively applicable to making printed circuit boards in particular.

3 Claims, No Drawings

ELECTROLYTIC COPPER PLATING USING A REDUCING AGENT

This is a continuation of application Ser. No. 07/929,164, filed Aug. 11, 1992, now abandoned.

BACKGROUND OF THE INVENTION

The present invention relates to an electrolytic copper plating method used for electrolytically plating copper on the surface of a catalyzed, electrically nonconductive substrate for printed circuit boards, etc.

So far, an electroless copper plating bath containing formaldehyde have been industrially available for depositing a copper film on an electrolytically nonconductive plastic substrate, e.g., epoxy resin. Then, copper electroplating is carried out. This electroless copper plating bath is widely used for printed circuit board production, e.g., for forming an electrically conductive film of copper in the throughhole in a printed circuit board as the material to be plated with copper.

However, this electroless copper plating bath has the following problems.

(1) It includes formaldehyde said to be carcinogenic.

(2) Its analysis and control are troublesome.

(3) It is required to bail out a plating solution from the bath as much as a fresh one is replenished thereto.

(4) Some limit is placed on to what degree the bath is loaded; that is, it is impossible to fill the bath up to the brim with the substrate to be treated.

(5) It poses a defective deposition problem due to hydrogen gas being trapped in minute holes.

(6) Much time is needed for plating.

(7) Cost reductions are difficult to achieve.

In order to solve these problems, several methods without recourse to electroless copper plating have been proposed in the art. These methods (usually called the direct plating methods ) are generally broken down into the following three types.

(1) Pd—Sn addition type, (2) Carbon black addition type, and (3) Organic conductive film addition type.

However, printed circuit boards produced by these methods have serious problems in connection with the adhesion between the copper foils and the plated deposits, the reliability of heat-resistant testing, etc.; in other words, there are only a few examples in which they have been successfully used on an industrial scale.

A method of applying electrolysis to an electroless copper plating, high-alkaline bath containing formalin has already been reported by Honma et al (see the preprints at the 4th Lecture Meeting of the Printed Circuit Board Society). The purpose of applying electrolysis to this bath is to increase the deposition rate of electroless copper plating much more and to make improvements in the properties of the deposited films. Again, this method is unpreferred in view of environmental hygiene because of the use of harmful formalin.

A typical electroless copper plating bath making no use of formalin is a dimethylamineborane bath developed by LeaRonal Inc. (see U.S. Ser. No. 314,537, now U.S. Pat. No. 4,877,450, or Japanese Patent Laid-Open Publication No. 2-305971). This bath is improved in terms of its stability and the film properties of deposits by using two chelating agents, and is used at the bath temperature of 51.7° to 73.9° C. and in the pH range of 6 to 9.5. Another typical electroless copper plating bath making no use of formalin is a hypophosphorous acid bath developed by MacDermid Inc. For this bath electrolysis is imperatively needed, because the deposition of electroless copper plating is not initiated even at a bath temperature of 50° to 60° C., unless it is electrically energized just after dipping. In addition, minute amounts of cobalt and nickel are added to this bath so as to effect self-deposition reactions.

A conventional process of making printed circuit boards—which has some relation to this invention—is set forth in Laid-Open Japanese Patent Publication No. 60-213085. According to the disclosure, a conductive film of copper is formed by electroless copper plating after drilling, catalyzing, polishing and imaging using dry film are carried out on a substrate, then copper and solder electroplating are carried out. Because of using electroless copper plating, this method has the aforesaid several problems as well.

In view of the problems associated with conventionally used electroless copper plating and several direct plating methods proposed so far in the art, an object of this invention is to provide an electrolytic copper plating method using a reducing agent, which can be used in place of conventional electroless copper plating, dispense with any harmful substance such as formaldehyde, be easily analyzed and controlled, form an electrically conductive film of copper on an electrically nonconductive substrate with improved adhesion thereto, and is effectively applicable to making printed circuit boards in particular.

As a result of intensive studies made to achieve the object mentioned above, we have now discovered that an electrically conductive film of copper can be well formed on an electrically nonconductive substrate material by carrying out electrolysis under constant pH and temperature conditions with the application of an electrolytic copper plating bath using a reducing agent, and so have accomplished the present invention.

SUMMARY OF THE INVENTION

Thus, this invention provides an electrolytic copper plating method using a reducing agent, characterized in that a catalyzed, electrically nonconductive substrate is dipped in a solution, which contains a copper salt, a copper-reducing agent for the acceleration of copper deposition and a copper-complexing agent and has a pH value of about 6 to 7.5, for electrolysis at a temperature of about 15° C. to 50° C., thereby forming an electrically conductive film of copper on said electrically nonconductive substrate.

DETAILED EXPLANATION OF THE INVENTION

In the ensuing description, the present invention will be explained at great length.

The copper salt is a metallic copper supply source, and to this end any copper compound may be added to a plating solution, provided that the anions have not a harmful influence on the plating bath. Pertinent copper salts, for instance, are copper sulfate, copper chloride, copper nitrate, copper hydroxide, copper sulfamate, copper carbonate and copper oxide. Among them, preference is given to copper sulfate and copper chloride. The concentration of copper ions in the plating bath, although variable in the range of 0.5 to 5 g/l, should preferably lie in the range of 1 to 2 g/l. It is noted that when the concentration of the complexing agent is high, a copper concentration higher than 2 g/l may be applied. It is also noted that a phosphorus copper anode (using an anode bag) may be used for the anode as the source for supplying copper ions to the plating solution. An insoluble anode (made of platinum, SUS, etc.) may be used as well.

No critical limitation is imposed on the reducing agent used, if it enables copper ions to be reduced to metallic copper. According to this invention, the reducing agent is electrolyzed in the bath of this invention, thereby effectively depositing copper on the catalyzed, electrically nonconductive substrate. The concentration of the reducing agent added to the bath of this invention is not well enough to effect copper reduction and deposition in the bath, and so does not have any effect without being used in combination with electrolysis. The most preferable reducing agent of all is dimethylaminoborane. The dimethylaminoborane concentration, although variable in the range of 0.5 to 20 g/l, should preferably lie in the range of 1 to 10 g/l. A concentration exceeding 20 g/l is not preferred, because it renders the bath unstable and causes the reducing agent to be much consumed. Hydrazines such as hydrazine hydrate, hydrazine hydrochlorate and hydrazine acetate and their salts as well as hypophosphites such as hypophosphorous acid and sodium hypophosphite and their salts may be effectively used as well. Their concentration in the bath, although variable in the range of 0.5 to 20 g/l, should preferably range from 1 to 10 g/l. These compounds are so stable in the neutral region that they can be used for electrolysis, thereby forming an electrically conductive film of high purity on the electrically nonconductive substrate. Note that there is no need of adding different metals such as nickel and cobalt as the catalyst for direct copper deposition.

Any known complexing agent may be used, if it can complex copper ions. For instance, use may be made of a polyamine and its salt, an aminocarboxylic acid and its salt, an amine alkanol compound, a hydroxycarboxylic acid and its salt.

The polyamines and their salts, for instance, may be represented by ethylenediamine and its sulfate, diethylenetriamine, diethylenetetramine and triethylenetetramine. It is noted that the concentration of the polyamine and its salt suitable to the solution of this invention, although variable in the range of 1 to 100 g/l, should preferably range from 5 to 50 g/l.

The aminocarboxylic acids and their salts, for instance, are represented by iminodiacetic acid and its sodium salt, nitrilotriacetic acid and its sodium salt, hydroxyethylethylenediaminetetraacetic acid, tetrahydroxyethylenediamine or dihydroxymethylethylenediaminediacetic acid, ethylenediaminetetraacetic acid and their sodium and potassium salts, diethylenetriaminepentaacetic acid and its sodium salt, triethylenetetraminehexaacetic acid, cyclohexane-1,2-diaminetetraacetic acid, ethylene glycol diethyl ether diaminetetraacetic acid, ethylenediaminetetrapropionic acid and N,N,N',N' -tetrakis-2(2-hydroxypropyl)ethylenediamine. It is noted that the concentrations of the aminocarboxylic acid and its salt suitable for the solution of this invention, although variable in the range of 1 to 100 g/l, should preferably lie in the range of 5 to 50 g/l.

Preferable amine alkanol compounds are mono-, di- and tri-ethanolamines. It is noted that the concentration of the amine alkanol compound suitable for the invention of this invention, although variable in the range of 5 to 200 ml/l, should preferably lie in the range of 50 to 100 ml/l.

The hydroxycarboxylic acids, for instance, are represented by tartaric acid, citric acid and gluconic acid, while the hydroxycarboxylates, for instance, are represented by sodium tartarate, potassium tartarate, sodium potassium tartarate, sodium citrate, potassium citrate, ammonium citrate, sodium gluconate and potassium gluconate. It is noted that the concentrations of these acids and salts in the bath of this invention, although variable in the range of 1 to 100 g/l, should preferably lie in the range of 5 to 50 g/l.

The complexing agents mentioned above may be used alone, but it is preferred that they are used in admixture forms, because the stability of the plating bath is improved with improvements in the properties of the deposited films.

In order to improve the properties of the bath of this invention and the film properties of deposits, conventional additives for electroless copper plating may be used as well. These additives, for instance, include cyanides, cyanates, sulfur-containing compounds such as sulfides and thio compounds, dipyridyl compounds and an ethylene oxide type surface active agents, all soluble in the plating solution of this invention.

The copper salt, reducing agent and complexing agent-containing solution, to which additives are added at need, is regulated to the pH range of 6 to 7.5, preferably 6.8 to 7.2 by the addition of an acid or alkali. This pH plays a particularly important role in plating substrate with water-, esp., alkali-soluble resists coated thereon for the production of printed circuit boards; that is, by regulating the pH to this range, it is possible to minimize attack on the plating resists. It is noted that generally available, rather than specially designed, water-soluble resists may be used to this end.

A pre-catalyzed, electrically nonconductive material for printed circuit boards, etc. is dipped in the thus prepared solution for electrolysis. Catalyzing or, in other words, catalyst addition or activation, is done by dipping the above-mentioned material, which has been suitably pretreated, in a solution containing, e.g., palladium and tin compounds, followed by water rinsing and optionally drying and other procedures.

For electrolysis, the solution is regulated to a temperature ranging from 15° to 50° C., preferably 20° to 30° C. By performing electrolysis in this temperature range, it is again to minimize attack on the resist. Under such pH and temperature conditions as mentioned above, no copper deposition by copper reduction takes place in the case of electroless plating using this solution; in other words, a copper deposition reaction does not occur without electrolysis. In addition, the use of the above-mentioned reducing agent enables copper to be effectively deposited by electrolysis. If air stirring is applied at the time of preparing the bath and electrolysis, then the stability of the bath is much more effectively improved.

For electrolysis according to the method of this invention, it is required that the area of the anode used account for ⅕ or more of that of the cathode. The use of the anode having a small area is unpreferred, because the smaller the area of the anode the more likely the voltage is to increase, resulting in the decomposition of the organic materials in the bath, for instance, the complexing agent and additives.

According to the bath of this invention, no copper deposition by copper reduction takes place under the pH and temperature conditions mentioned above. Referring here to the conditions for electrolysis, the cathodic current density lies in the range of 0.1 to 1.0 A/dm$^2$, preferably 0.3 to 0.5 A/dm$^2$. The plating time lies in the range of 1 to 10 minutes, preferably 2 to 5 minutes. In this invention, a general-purpose direct current power source may be used as the power source. It is noted, however, that a pulse, PR or other power source is very effective so as to achieve uniform electrodeposition and improve the properties of the deposited film. In addition, use is effectively made of a current inversion type electrolysis which enables polarity conversion take place more fastly than would be possible with conventional PR electrolysis.

Unlike electroless copper plating, the bath of this invention enables a reliable conductive film of copper to be obtained in a short time. In terms of covering a through-hole, for instance, a 0.3-μm thick copper deposit obtained by (20-minute) electroless copper plating is almost equivalent to a deposit obtained by plating at 0.5 A/dm$^2$ for 2 minutes and copper sulfate plating at 2 A/dm$^2$ for 30 seconds (a total film thickness of 0.3 μm) with the use of the bath of this invention.

The method of this invention is well applicable to producing printed circuit boards in particular. Set out below are general steps of making printed circuit boards, including the electrolytic copper plating according to this invention.

Substrate (copper-clad laminated board)
Drilling
Catalyzing
   (1) Degreasing
      Water rinsing
   (2) Soft etching
      Water rinsing
   (3) Pre-dipping
      Water rinsing
   (4) Catalyst
Drying
Polishing
Alkali-soluble dry film imaging (or resist ink printing)
Degreasing
Water rinsing
Soft etching
(Accelerator)
(Water rinsing)
Electrolytic copper plating
Water rinsing
Acid dipping
Water rinsing
Copper sulfate electroplating
Water rinsing
Acid dipping
Solder electroplating
Water rinsing
Alkali-soluble dry film stripping
Etching
Solder stripping
Solder mask coating
HAL (hot air leveller)

EXAMPLES

The present invention will now be explained at great length with some examples in which the present method was applied to printed circuit board production in particular and one comparative example in which electroless plating was done with no application of electrolysis.

Example 1

| | |
|---|---|
| Copper sulfate | 5 g/l |
| Tetrasodium ethylenediaminetetraacetate | 5 g/l |
| Dimethylamineborane | 1 g/l |
| pH (adjusted by 25% sulfuric acid) | 7.0 |
| Temperature | 25° C. |
| Current density | 0.2 A/dm$^2$ |
| Time | 5 min. |

A 25 cm×33 cm (with a thickness of 1.6 mm, 2.4 mm or 3.2 mm), drilled, copper-clad epoxy laminated board was activated by ordinary palladium/tin activation treatments, and was then subjected to imaging treatments using an alkali-soluble type dry film. After degreasing and accelerator treatments, this board was electrolyzed in the above-mentioned solution under the above-mentioned conditions. Thereafter, the board was plated to a thickness of 25 μm with copper and a thickness of 10 μm with solder, followed by resist stripping and etching.

The thus obtained printed circuit board was comparable to that produced conventionally, and well stood up to heat-resistant testing according to MIL-P-55110D (288° C./10 sec., one cycle).

In another run, a printed circuit board was obtained by using an alkali-soluble type resist ink in place of the alkali-soluble type dry film. Again, this board was comparable to that produced conventionally, and well stood up to heat-resistant testing according to MIL-P55110D (288° C./10 sec., one cycle).

Example 2

| | |
|---|---|
| Copper chloride | 5 g/l |
| Disodium ethylenediaminetetraacetate | 5 g/l |
| Sodium potassium tartarate | 10 g/l |
| Dimethylamineborane | 10 g/l |
| Polyethylene glycol | 10 ppm |
| (with a molecular weight of 6000) | |
| pH (adjusted by 25% sulfuric acid) | 7.0 |
| Temperature | 25° C. |
| Current density | 0.5 A/dm$^2$ |
| Time | 5 min. |

A 25 cm×33 cm (with a thickness of 1.6 mm, 2.4 mm or 3.2 mm), drilled, copper-clad epoxy laminated board was activated by ordinary palladium/tin activation treatments, and was then subjected to imaging treatments using an alkali-soluble type dry film. After degreasing and accelerator treatments, this board was electrolyzed in the above-mentioned solution under the above-mentioned conditions. Thereafter, the board was plated to a thickness of 25 μm with copper and a thickness of 10 μm with solder, followed by resist stripping and etching.

The thus obtained printed circuit board was comparable to that produced conventionally, and well stood up to heat-resistant testing according to MIL-P-55110D (288° C./10 sec., one cycle).

Example 3

| | |
|---|---|
| Copper sulfate | 5 g/l |
| Tetrasodium ethylenediaminetetraacetate | 20 g/l |

| | |
|---|---|
| Hydrazine hydrate | 20 g/l |
| Sodium borate | 10 g/l |
| pH (adjusted by 25% sulfuric acid) | 7.0 |
| Temperature | 30° C. |
| Current density | 0.2 A/dm$^2$ |
| Time | 5 min. |

A 25 cm×33 cm (with a thickness of 1.6 mm, 2.4 mm or 3.2 mm), drilled, copper-clad epoxy laminated board was activated by ordinary palladium/tin activation treatments, and was then subjected to imaging treatments using an alkali-soluble type dry film. After degreasing and accelerator treatments, this board was electrolyzed in the above-mentioned solution under the above-mentioned conditions. Thereafter, the board was plated to a thickness of 25 μm with copper and a thickness of 10 μm with solder, followed by resist stripping and etching.

The thus obtained printed circuit board was comparable to that produced conventionally, and well stood up to heat-resistant testing according to MIL-P-55110D (288° C./10 sec., one cycle).

Example 4

| | |
|---|---|
| Copper sulfate | 5 g/l |
| Tetrasodium ethylenediaminetetraacetate | 10 g/l |
| Sodium hypophosphite | 10 g/l |
| pH (adjusted by 25% sodium hydroxide) | 7.0 |
| Temperature | 30° C. |
| Current density | 0.5 A/dm$^2$ |
| Time | 5 min. |

A 25 cm×33 cm (with a thickness of 1.6 mm, 2.4 mm or 3.2 mm), drilled, copper-clad epoxy laminated board was activated by ordinary palladium/tin activation treatments, and was then subjected to imaging treatments using an alkali-soluble type dry film. After degreasing and accelerator treatments, this board was electrolyzed in the above-mentioned solution under the above-mentioned conditions. Thereafter, the board was plated to a thickness of 25 μm with copper and a thickness of 10 μm with solder, followed by resist stripping and etching.

The thus obtained printed circuit board was comparable to that produced conventionally, and well stood up to heat-resistant testing according to MIL-P-55110D (288° C./10 sec., one cycle).

Comparative Example 1

(with no application of electrolysis)

| | |
|---|---|
| Copper sulfate | 5 g/l |
| Tetrasodium ethylenediaminetetraacetate | 5 g/l |
| Dimethylamineborane | 1 g/l |
| Sodium sulfate | 50 g/l |
| pH (adjusted by 25% sulfuric acid) | 7.0 |
| Temperature | 25° C. |

A 25 cm×33 cm (with a thickness of 1.6 mm, 2.4 mm or 3.2 mm), drilled, copper-clad epoxy laminated board was activated by ordinary palladium/tin activation treatments, and was then subjected to imaging treatments using an alkali-soluble type dry film. After degreasing and accelerator treatments, this board was dipped in the above-mentioned solution under the above-mentioned conditions. Thereafter, the board was plated to a thickness of 25 μm with copper, but no copper deposition was found in the through-hole.

As explained above, the electrolytic copper plating method using a reducing agent according to this invention makes it feasible to achieve printed circuit board production that is unachievable until now, and have the following merits.

(1) Unlike electroless copper plating, troublesome analysis and control are dispensed with (the present method is easy to control).

(2) No carcinogenic formaldehyde is used (the present method ensures safe working environment).

(3) Defective deposition due to the trapping of hydrogen gas by minute holes is less likely to occur.

(4) Plating is carried out more shortly and covered more rapidly than electroless copper plating.

(5) Not costly.

(6) The product can be produced in a short period by the application of the above-mentioned process for producing printed circuit boards.

(7) Existing plating equipment can be used as such.

(8) Inexpensive water-soluble dry films can be used.

As stated above, the present invention is applicable to the aforesaid process for producing printed circuit boards with the maximum effectiveness. In addition, the catalyzing treatments in conventional electroless copper plating processes can be used with no special modification made thereto.

As will be understood from the foregoing, the plating bath of this invention makes processing time short, ensures safe working environment and excels in reliability and cost, and so makes a great contribution to the field of printed circuit board production.

What is claimed is:

1. An electrolytic copper plating method using a reducing agent, comprising dipping a catalyzed, electrically nonconductive substrate in a solution which contains a copper salt, a copper-reducing agent for the acceleration of copper deposition, said copper-reducing agent being selected from the group consisting of dimethylamineborane, a hydrazine and its salts, hypophosphorous acid and its salts, and is present in said solution at a concentration at 0.5 to 20 g/l, and a copper-complexing agent and which has a pH value of about 6 to 7.5, and subjecting said catalyzed, electrically nonconductive substrate to electrolysis in said solution at a temperature of about 20° C. to 30° C., thereby forming an electrically conductive film of copper on said nonconductive substrate.

2. An electrolytic copper plating method as claimed in claim 1, wherein said complexing agent is at least one selected from the group consisting of a polyamine and its salts, an aminocarboxylic acid and its salts, an amine alkanol compound, and a hydroxycarboxylic acid and its salts.

3. An electrolytic copper plating method as claimed in claim 1, wherein at least one additive is further added to said solution to improve the properties of said solution and the resulting, electrolytically deposited film.

* * * * *